United States Patent
Camras et al.

(10) Patent No.: US 10,490,708 B2
(45) Date of Patent: *Nov. 26, 2019

(54) WAVELENGTH CONVERTED LIGHT EMITTING DEVICE INCLUDING A SEMICONDUCTOR WAVELENGTH CONVERTING MATERIAL AND A CERAMIC PHOSPHOR

(71) Applicant: Lumileds LLC, San Jose, CA (US)

(72) Inventors: Michael David Camras, Sunnyvale, CA (US); Oleg Borisovich Shchekin, San Francisco, CA (US); Rafael Ignacio Aldaz Granell, Pleasanton, CA (US); Patrick Nolan Grillot, San Jose, CA (US); Frank Michael Steranka, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/161,571

(22) Filed: May 23, 2016

(65) Prior Publication Data

US 2016/0268487 A1 Sep. 15, 2016

Related U.S. Application Data

(62) Division of application No. 13/824,014, filed as application No. PCT/IB2011/054200 on Sep. 23, 2011, now Pat. No. 9,431,585.
(Continued)

(51) Int. Cl.
*H01L 33/50* (2010.01)
*H01L 25/075* (2006.01)
(Continued)

(52) U.S. Cl.
CPC ........ *H01L 33/504* (2013.01); *H01L 25/0753* (2013.01); *H01L 33/22* (2013.01);
(Continued)

(58) Field of Classification Search
None
See application file for complete search history.

(56) References Cited

U.S. PATENT DOCUMENTS 5,436,924 A * 7/1995 Kamei .................. B82Y 20/00
372/45.01
7,102,152 B2 9/2006 Chua et al.
(Continued)

FOREIGN PATENT DOCUMENTS

CN 1812092 A 8/2006
CN 101627482 A 1/2010
(Continued)

OTHER PUBLICATIONS

CN First Office Action and Search Report—Application No. 201180046854.8, dated Jul. 1, 2015, 40 pages.
(Continued)

*Primary Examiner* — Bilkis Jahan

(57) ABSTRACT

Embodiments of the invention include a semiconductor light emitting device capable of emitting first light having a first peak wavelength and a semiconductor wavelength converting element capable of absorbing the first light and emitting second light having a second peak wavelength. The semiconductor wavelength converting element is attached to a support and disposed in a path of light emitted by the semiconductor light emitting device. The semiconductor wavelength converting element is patterned to include at least two first regions of semiconductor wavelength converting material and at least one second region without
(Continued)

semiconductor wavelength converting material disposed between the at least two first regions.

13 Claims, 3 Drawing Sheets

Related U.S. Application Data

(60) Provisional application No. 61/387,681, filed on Sep. 29, 2010.

(51) Int. Cl.
*H01L 33/22* (2010.01)
*H01L 33/28* (2010.01)
*H01L 33/30* (2010.01)
*H01L 33/44* (2010.01)
*H01L 33/58* (2010.01)

(52) U.S. Cl.
CPC ............. *H01L 33/28* (2013.01); *H01L 33/30* (2013.01); *H01L 33/44* (2013.01); *H01L 33/507* (2013.01); *H01L 33/508* (2013.01); *H01L 33/58* (2013.01); *H01L 2924/0002* (2013.01); *H01L 2933/0041* (2013.01)

(56) References Cited

U.S. PATENT DOCUMENTS

| | | | |
|---|---|---|---|
| 7,284,813 B2 | 10/2007 | Otsuki | |
| 7,341,878 B2 | 3/2008 | Krames et al. | |
| 7,419,839 B2 | 9/2008 | Camras et al. | |
| 8,299,473 B1* | 10/2012 | D'Evelyn | H01L 33/44 257/79 |
| 8,748,911 B2 | 6/2014 | Haase et al. | |
| 8,941,566 B2 | 1/2015 | Haase | |
| 9,431,585 B2* | 8/2016 | Camras | H01L 25/0753 |
| 2001/0009060 A1* | 7/2001 | Browning | H01J 9/39 29/458 |
| 2004/0257797 A1* | 12/2004 | Suehiro | H01L 33/507 362/34 |
| 2005/0269582 A1* | 12/2005 | Mueller | C04B 35/44 257/94 |
| 2006/0006408 A1 | 1/2006 | Suehiro et al. | |
| 2007/0024173 A1 | 2/2007 | Braune | |
| 2007/0221867 A1 | 9/2007 | Beeson et al. | |
| 2007/0284565 A1 | 12/2007 | Leatherdale et al. | |
| 2008/0012031 A1 | 1/2008 | Jang et al. | |
| 2008/0116467 A1* | 5/2008 | Mueller | C04B 35/584 257/89 |
| 2008/0121919 A1 | 5/2008 | Krames et al. | |
| 2008/0149956 A1* | 6/2008 | Mueller-Mach | C04B 35/44 257/98 |
| 2008/0217639 A1 | 9/2008 | Kim et al. | |
| 2009/0160026 A1* | 6/2009 | Suzuki | C30B 25/02 257/615 |
| 2009/0261708 A1 | 10/2009 | Moseri et al. | |
| 2009/0272998 A1 | 11/2009 | Berben et al. | |
| 2010/0012964 A1* | 1/2010 | Copic | C04B 35/584 257/98 |
| 2010/0129598 A1 | 5/2010 | Su et al. | |
| 2010/0140641 A1 | 6/2010 | Kinomoto et al. | |
| 2010/0289039 A1 | 11/2010 | Van Gorkom et al. | |
| 2011/0186877 A1 | 8/2011 | Haase et al. | |
| 2011/0278641 A1* | 11/2011 | Grolier | H01L 33/0095 257/102 |
| 2012/0068209 A1 | 3/2012 | Andrews | |
| 2013/0187184 A1 | 7/2013 | Camras et al. | |

FOREIGN PATENT DOCUMENTS

| | | |
|---|---|---|
| JP | 2005-285800 | 10/2005 |
| JP | 2006-114900 | 4/2006 |
| JP | 2006-005367 | 5/2006 |
| JP | 2006-523017 A | 10/2006 |
| JP | 2007-122390 | 5/2007 |
| JP | 2008-021988 | 1/2008 |
| JP | 2010-141033 | 6/2010 |
| JP | 2010-128724 | 8/2010 |
| JP | 2010182724 A2 | 8/2010 |
| RU | 2233013 C2 | 11/2003 |
| TW | 200611967 | 5/2006 |
| TW | 200812117 A | 3/2008 |
| TW | 200845456 A | 11/2008 |
| TW | 200847490 A | 12/2008 |
| TW | 201006013 A | 2/2010 |
| TW | 201010496 A | 3/2010 |
| WO | WO-2006/097868 A2 | 9/2006 |
| WO | WO-2007063460 A1 | 6/2007 |
| WO | WO-2007134582 A1 | 11/2007 |
| WO | WO-2009/131627 | 10/2009 |
| WO | WO-2009/148717 A2 | 12/2009 |
| WO | WO-2010074987 A2 | 7/2010 |
| WO | WO-2010075177 A2 | 7/2010 |

OTHER PUBLICATIONS

CN OA2MO, 201180046854.8, dated Feb. 15, 2016, 25 pps.
EPO as ISA, "International Search Report and Written Opinion" for Application No. PCT?IB2011/054200, dated Aug. 7, 2012, 25 pages.
Guo et al., "Photon Recycling Semiconductor Light Emitting Diode", Light-Emitting Diodes: Researh, Manufacturing, and Applications IV, Proceedings of SPIE, vol. 3938, 2000 pp. 60-67.
JP OA for Application No. 2013-530838, dated Apr. 14, 2015, 8 pages.
JP OA, Application 2013-530838, dated Mar. 23, 2016, 4 pps.
RU First Office Action for Application No. 2013119742, dated Sep. 29, 2015, 8 pages.
RU Notice of Allowance, Application 2013119742, dated Apr. 18, 2016, 14 pps.
TW Office Action for Application No. 100135071, dated Mar. 27, 2015, 16 pgs.
CN Office Action, Application 201180046854.8, dated Jul. 28, 2016, 21 pps.

* cited by examiner

WAVELENGTH CONVERTED LIGHT EMITTING DEVICE INCLUDING A SEMICONDUCTOR WAVELENGTH CONVERTING MATERIAL AND A CERAMIC PHOSPHOR

CROSS REFERENCE TO RELATED APPLICATIONS

This application is a divisional of U.S. patent application Ser. No. 13/824,014, filed Mar. 15, 2013, and titled "WAVELENGTH CONVERTED LIGHT EMITTING DEVICE", which is a § 371 application of International Application No. PCT/IB2011/054200, filed Sep. 23, 2011, which claims priority to U.S. Provisional Application No. 61/387,681, filed Sep. 29, 2010. International Application No. PCT/IB2011/054200 and U.S. Provisional Application No. 61/387,681 are incorporated herein.

BACKGROUND

Field of Invention

The present invention relates to a wavelength converted semiconductor light emitting device.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates an LED described in more detail in U.S. Pat. No. 7,341,878. A semiconductor structure 130 including a light emitting region is attached to ceramic phosphor 52 by interface 56. Contacts 18 and 20 are formed on semiconductor structure 130, which are connected to package element 132 by metal interfaces 134. In some embodiments, all of the layers disposed between package element 132 and ceramic phosphor 52 have a thickness less than 100 microns. Though FIG. 1 illustrates semiconductor structure 130 mounted on package element 132 in a flip chip configuration where both contacts 18 and 20 are formed on the same side of the semiconductor structure, in an alternative embodiment, a portion of ceramic phosphor 52 may be removed such that contact 18 is formed on the opposite side of semiconductor structure 130 as contact 20.

U.S. Pat. No. 7,341,878 teaches that any luminescent material with the desirable properties of phosphors, such as high absorption of light emitted by the primary light emitting layer and high quantum efficiency, may be used to efficiently produce light in the above-described embodiments. Wavelength-converting materials with a large imaginary component of refractive index, k, at wavelengths emitted by the light emitting region and negligible k at the converted wavelength, such as for example some III-V and II-VI semiconductors, may be used in place of phosphors. In particular, in appropriate materials, at wavelengths emitted by the primary light emitting region, k is greater than 0.01, more preferably greater than 0.1, and more preferably greater than 1. A means for extracting light from the luminescent material may be provided, such as texturing, roughening, or shaping.

SUMMARY

It is an object of the invention to provide a wavelength converted semiconductor light emitting device that efficiently emits light.

Embodiments of the invention include a semiconductor light emitting device capable of emitting first light having a first peak wavelength and a semiconductor wavelength converting element capable of absorbing the first light and emitting second light having a second peak wavelength. The semiconductor wavelength converting element is attached to a support and disposed in a path of light emitted by the semiconductor light emitting device. The semiconductor wavelength converting element is patterned to include at least two first regions of semiconductor wavelength converting material and at least one second region without semiconductor wavelength converting material disposed between the at least two first regions.

Embodiments of the invention include a semiconductor light emitting device capable of emitting first light having a first peak wavelength and a semiconductor wavelength converting element capable of absorbing the first light and emitting second light having a second peak wavelength. The semiconductor wavelength converting element is disposed in a path of light emitted by the semiconductor light emitting device and patterned to include at least two first regions of semiconductor wavelength converting material and at least one second region without semiconductor wavelength converting material disposed between the at least two first regions. A wavelength converting element is disposed in the at least one second region, the wavelength converting element being capable of absorbing the first light and emitting third light having a third peak wavelength.

Embodiments of the invention include a first light emitting device capable of emitting first light having a first peak wavelength, a second light emitting device capable of emitting second light having a second peak wavelength. The second light emitting device includes a semiconductor light emitting device capable of emitting third light having a third peak wavelength and a semiconductor wavelength converting element capable of absorbing the third light and emitting second light.

A semiconductor wavelength converting element may provide efficient and spectrally narrow wavelength conversion, for excellent color rendering and high luminous output.

DETAILED DESCRIPTION

In embodiments of the invention, a semiconductor wavelength converting element is combined with a semiconductor light emitting device. Though in the examples below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, or Si-based materials may be used.

Figure 1:
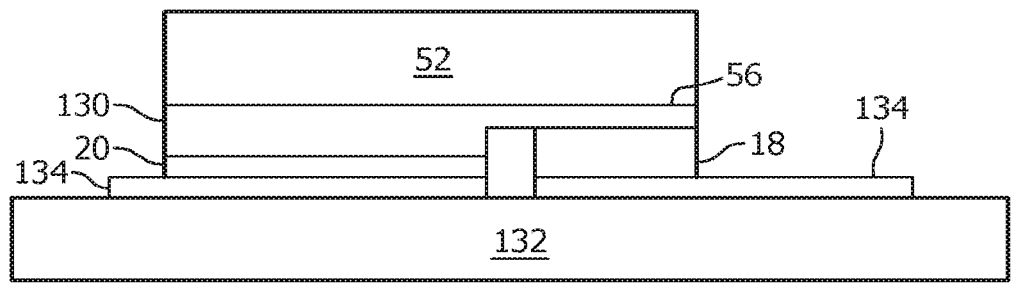
FIG. 1 illustrates a prior art device including a ceramic phosphor layer attached to an LED.
Figure 2:
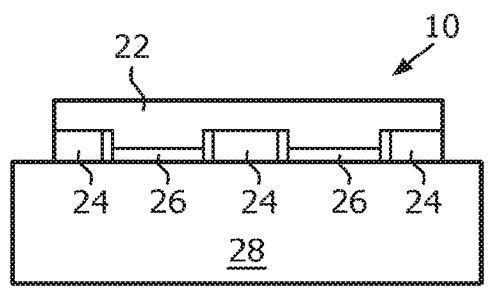
FIG. 2 illustrates a thin film flip chip semiconductor light emitting device.
Figure 3:
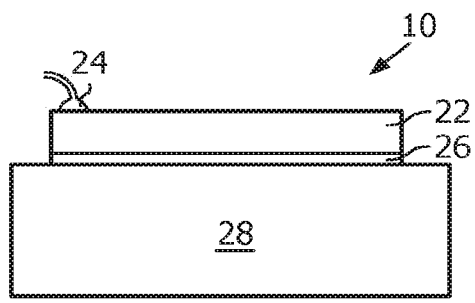
FIG. 3 illustrates a vertical semiconductor light emitting device.

Any suitable LED may be used. FIGS. 2 and 3 illustrate two examples of suitable LEDs 10. To make the devices illustrated in FIGS. 2 and 3, a semiconductor structure 22 is grown over a growth substrate. The semiconductor structure 22 includes a light emitting or active region sandwiched between n- and p-type regions. An n-type region may be grown first and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers.

P-contact metal 26 is disposed on the p-type region, then portions of the p-type region and active region may be etched away to expose an n-type layer for metallization, as illustrated in FIG. 2. The p-contacts 26 and n-contacts 24 of this embodiment are on the same side of the device. As illustrated in FIG. 2, p-contacts 26 may be disposed between multiple n-contact regions 24, though this is not necessary. In some embodiments either or both the n-contact 24 and the p-contact 26 are reflective and the device is mounted such that light is extracted through the top of the device in the orientation illustrated in FIG. 2. In some embodiments, the contacts may be limited in extent or made transparent, and the device may be mounted such that light is extracted through the surface on which the contacts are formed. The semiconductor structure is attached to a mount 28. The growth substrate may be removed, as illustrated in FIG. 2, or it may remain part of the device. In some embodiments, the semiconductor layer exposed by removing the growth substrate is patterned or roughened, which may improve light extraction from the device.

In the vertical injection LED illustrated in FIG. 3, an n-contact is formed on one side of the semiconductor structure, and a p-contact is formed on the other side of the semiconductor structure. For example, the p-contact 26 may be formed on the p-type region and the device may be attached to mount 28 through p-contact 26. All or a portion of the substrate may be removed and an n-contact 24 may be formed on a surface of the n-type region exposed by removing a portion of the substrate. Electrical contact to the n-contact may be made with a wire bond as illustrated in FIG. 3, or with any other suitable structure.

A semiconductor wavelength converting element is disposed in the path of light emitted from the LED 10. The semiconductor wavelength converting element may be the only wavelength converting material in the device, or may be combined with other wavelength converting materials such as phosphors, quantum dots, other semiconductor wavelength converting elements, or dyes to create white light or monochromatic light of other colors. Other wavelength converting materials may be, for example, a pre-formed ceramic phosphor layer that is glued or bonded to the LED or spaced apart from the LED, or a powder phosphor or quantum dots disposed in an inorganic or organic encapsulant that is stenciled, screen or ink jet printed, sprayed, sedimented, evaporated, sputtered, or otherwise dispensed over the LED. The wavelength converting materials absorb light emitted by the LED and emit light of a different wavelength. All or only a portion of the light emitted by the LED may be converted by the wavelength converting materials. Unconverted light emitted by the LED may be part of the final spectrum of light, though it need not be. A semiconductor wavelength converting element may efficiently convert light that it absorbs to light of a different wavelength. The light emitted by a semiconductor wavelength converting element may have a narrower spectral width than light emitted by conventional phosphors. Narrower spectral width may be advantageous, particularly for a red-emitting semiconductor wavelength converting element, for producing devices that emit white light with good color rendering and high luminous efficiency.

Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. Examples of suitable wavelength converting materials include $(Lu,Y,Gd)_3(AlGa)_5O_{12}:CePr$, $Lu_3Al_5O_{12}:Ce3+$, $Y_3Al_5O_{12}:Ce3+$, $(Sr,Ca,Ba)Si_xN_yO_z:Eu2+$ ($x=1.5$-$2.5$, $y=1.5$-$2.5$, $z=1.5$-$2.5$), $(Ba,Ca,Sr)_3Si_6O_{12}N_2:Eu2+$, $(Sr,Ca,Ba)_2Si_5N_8:Eu2+$, and $SrSi_2N_2O_2:Eu2+$.

Figure 4:
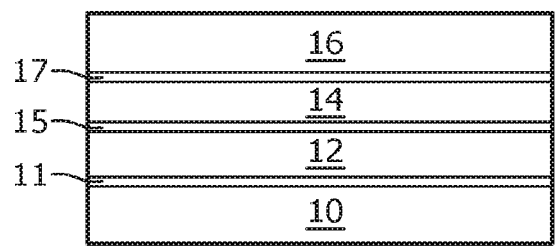
FIG. 4 illustrates an LED combined with a semiconductor wavelength converting element, an optional second wavelength converting element, and an optional light extraction element.

FIG. 4 illustrates an embodiment of the invention including an LED 10 and a semiconductor wavelength converting element 12. Semiconductor wavelength converting element 12 is at least one epitaxially-grown semiconductor layer. Unlike the active region of LED 10, which is electrically pumped, meaning that it emits light when forward biased through the n- and p-contacts, the semiconductor wavelength converting element is optically pumped, meaning that it absorbs light of a first wavelength (the light from the active region of LED 10) and in response emits light of a second, longer wavelength. The semiconductor wavelength converting element 12 is electrically passive and therefore need not be connected to metal contacts. Alternatively, the semiconductor wavelength converting element 12 may be doped so that it is electrically conductive and may be part of the electrical conduction path of the n or p-contact of LED 10.

Semiconductor wavelength converting element 12 is grown on the LED 10 or on a separate growth substrate. In some embodiments, semiconductor wavelength converting element 12 is grown on a separate growth substrate, independent from the growth and processing of LED 10. Semiconductor wavelength converting element 12 may be bonded to LED 10 by an optional bonding layer 11, or may be directly bonded to LED 10 without an intervening bonding layer. After bonding to LED 10 or to another structure for mechanical support, the growth substrate of the semiconductor wavelength converting element 12 may remain part of the device or may be removed by any suitable technique, such as etching, grinding, or laser melting and lift-off.

Figure 5:
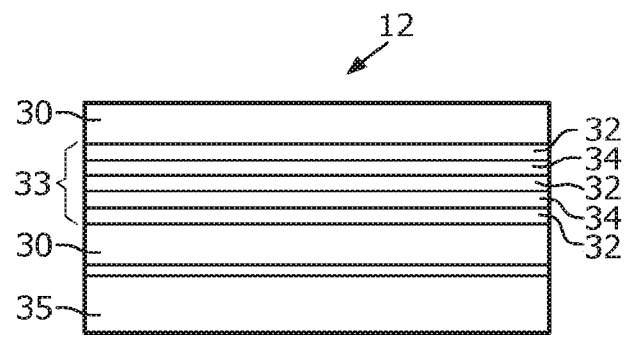
FIG. 5 illustrates one example of a semiconductor wavelength converting element.

In some embodiments, semiconductor wavelength converting element 12 is a single light emitting layer. FIG. 5 illustrates a multi-layer semiconductor wavelength converting element 12. In the structure illustrated in FIG. 5, three light emitting layers 32 are separated by barrier layers 34. More or fewer light emitting layers 32 may be used. For example, light emitting layers 32 and barrier layers 34 may form a multi-quantum well or superlattice structure. The light emitting layers 32 and barrier layers 34 are disposed between two optional cladding or confining layers 30. Confining layers 30 may have the same composition, doping, and thickness as barrier layer 34, or may be different. In some embodiments, the light emitting region 33 of semiconductor wavelength converting element 12 is a single light emitting layer 32 disposed between two cladding layers 30, as a double heterostructure or a single quantum well heterostructure, for example.

Semiconductor wavelength converting element 12 may be designed to minimize absorption in the non-light emitting layers, such as confining layers 30 and barrier layers 34 for example, to efficiently convert or transmit light from LED 10 with minimal loss, and to maximize output of the converted light. For total conversion, all photons emitted by LED 10 (UV, blue, green, and/or yellow for example) and incident on semiconductor wavelength converting element 12 may be absorbed to produce photons of converted light (green, yellow, and/or red for example), while minimizing the losses and maximizing the efficiency of the conversion.

The confining layers 30, barrier layers 34, and light emitting layers 32 are all capable of absorbing light from LED 10, but generally only the light emitting layers emit light. Accordingly, in some embodiments, it is desirable to maximize the thickness of the light emitting layers relative to the thickness of the non-light emitting confining layers and barrier layers. The total thickness of the semiconductor wavelength converting element affects the amount of light from LED 10 absorbed by the wavelength converting element through Beer's Law, $I_{transmitted}=I_0 e^{-\alpha x}$, where x is the thickness of the light absorbing material (the semiconductor wavelength converting element), and $\alpha$ is the absorption coefficient. If the wavelength converting element is too thick, no light from LED 10 will get through. In some embodiments, the light emitting layer includes defects that act as non-radiative recombination centers. If the light emitting layers are too thick, non-radiative recombination may dominate over radiative recombination, making the efficiency of the semiconductor wavelength converting element undesirably low. In addition, in some embodiments, the confining layers have surfaces that act as sinks for carrier recombination. If the confining layers are too thin, the carriers can escape from the light emitting layers and diffuse to the surfaces of the confining layers where they recombine non-radiatively, decreasing efficiency of the semiconductor wavelength converting element.

Surface passivation of the semiconductor wavelength-converting element may reduce the density of surface states and reduce surface recombination. Surface passivation can be particularly important for high-Al-content confining layers which may have high surface recombination velocities (for example, on the order of 106 cm/s for $In_{0.5}Al_{0.5}P$). Surface passivation of the semiconductor wavelength converting element may passivate dangling bonds and defects of the semiconductor surface and may reduce surface recombination. Examples of suitable surface passivation materials and techniques include sulfur, applied with, for example, a $(NH_4)_2S_x$ treatment, hydrogen passivation, oxygen passivation, nitrogen passivation, and native oxide formation.

In some embodiments, at least one non-light emitting layer in semiconductor wavelength converting element 12, such as confining layer 30 or barrier layer 34, for example, is an aluminum-containing III-phosphide or III-arsenide material such as AlInGaP, AlInGaAs or AlInP. The Al content of the AlInGaP or AlInP layers may be high, (Al≥50% for example). Barrier layers 34 and/or cladding layers 30 may be AlInGaP or AlInP layers that are not intentionally doped or lightly n-doped (for example, to a dopant concentration less than 1018 cm-3). These barrier layers 34 and cladding layers 30 are preferably thin, for example less than 2000 Å thick in some embodiments and less than 1000 Å in some embodiments. In some embodiments, the confining layer 30 closest to LED 10 is less than 1000 Å thick. The confining layer 30 opposite LED 10 may be thicker and can be 1 μm thick or more for example. In some embodiments, the light emitting layer 32 is $(Al_xGa_{1-x})_{0.5}In_{0.5}P$ which is lattice matched to GaAs. Such light emitting layers cover a wavelength range from green to red (around 5300 Å or 2.33 eV for x=1 to 6600 Å or 1.89 eV for x=0). GaP with a 4% lattice mismatch to GaAs for example could be used as a confining layer 30, barrier layer 34, or light emitting layer 32. The total thickness of all light emitting layers in the semiconductor wavelength converting element is between 10 nm and 3 μm in some embodiments, between 20 nm and 1 μm in some embodiments, at least 10 nm in some embodiments, and between 50 and 100 nm in some embodiments.

In some embodiments, at least one light emitting layer 32 of semiconductor wavelength converting element 12 is a II-VI compound semiconductor such as CdMgZnSe closely latticed match to InP, which covers a wavelength range from blue to red (4600 Å to 6300 Å). Examples of suitable light emitting layers 32 are described in US 2007/0284565, which is incorporated herein by reference. In a II-VI embodiment, a confining layer 30 may be thicker if the composition is tuned to be transparent to the pump wavelength, for example $Cd_{0.24}Mg_{0.43}Zn_{0.33}Se$ has a bandgap of 2.9 eV or 4280 Å. Barriers 34 for example can be precisely tuned to absorb the pump, for example, $Cd_{0.35}Mg_{0.27}Zn_{0.38}Se$ has a bandgap of 2.6 eV or 4800 Å. The light emitting layer or layers 32 may be precisely tuned for the desired converted wavelength for example $Cd_{0.33}Zn_{0.67}Se$ emits in the green at 2.3 eV or 5400 Å to $Cd_{0.70}Zn_{0.30}Se$ that emits in the red at 1.9 eV or 655 nm. As with the III-V embodiments described above, the II-VI wavelength converter may have a light emitting region that is a multiple quantum well structure, a superlattice, a single layer, a double heterostructure, or a single quantum well heterostructure, for example.

In some embodiments, semiconductor wavelength converting element 12 includes a support 35 to add thickness and mechanical robustness to the structure. Any relatively transparent, translucent, scattering, or wavelength converting material such as sapphire, glass, SiC, ScAlMgO, ZnS, ZnSe, GaP, ceramic, ceramic phosphor, phosphor or a scattering material in glass, or a polymer for example could be used. In such embodiments, the total thickness of the semiconductor wavelength converting element may be 20 μm or more. In other embodiments, the total thickness of semiconductor wavelength converting element 12 is 5 μm or less. In some embodiments, the semiconductor wavelength converting element 12 includes a support 35 comprising a ceramic phosphor. In some embodiments, support 35 is an optical element such as a lens. For example, support 35 may be a hemispherical lens or a Fresnel lens. In some embodiments, for example if support 35 is a lens, the diameter of support 35 may be greater than the length of an edge or of a diagonal of LED 10.

The semiconductor wavelength converting element 12 may be a freestanding structure that is attached to LED 10, a support 35, or another layer or material such as a ceramic phosphor for example. The semiconductor wavelength converting element material may also be cleaved, broken, powdered, or ground and added to a binder, such as silicone, sol gel, or a bonding material or layer such as those listed below for example. The semiconductor wavelength converting element 12 may be quantum dots or nanoparticles.

Bonding layer 11 may be any suitable material, such as lead chloride, lead bromide, potassium fluoride, zinc fluoride, an oxide of aluminum, antimony, bismuth, boron, lead, lithium, phosphorus, potassium, silicon, sodium, tellurium, thallium, tungsten, or zinc, or any mixtures thereof. Bonding layer 11 may also comprise III-V semiconductors including but not limited to gallium arsenide, gallium nitride, gallium phosphide, and indium gallium phosphide; II-VI semiconductors including but not limited to cadmium selenide, cadmium sulfide, cadmium telluride, zinc sulfide, zinc selenide, and zinc telluride; group IV semiconductors and compounds including but not limited to germanium, silicon, and silicon carbide; organic semiconductors, oxides, metal oxides, and rare earth oxides including but not limited to an oxide of aluminum, antimony, arsenic, bismuth, boron, cadmium, cerium, chromium, cobalt, copper, gallium, germanium, indium, indium tin, lead, lithium, molybdenum, neodymium, nickel, niobium, phosphorous, potassium, silicon, sodium, tellurium, thallium, titanium, tungsten, zinc, or zirconium; oxyhalides such as bismuth oxychloride; fluorides, chlorides, and bromides, including but not limited to fluorides, chlorides, and bromides of calcium, lead, magnesium, potassium, sodium, and zinc; metals including but not limited to indium, magnesium, tin, and zinc; yttrium aluminum garnet (YAG), phosphide compounds, arsenide compounds, antimonide compounds, nitride compounds, high index organic compounds; and mixtures or alloys thereof. The index of refraction of bonding layer 11 may be greater than 1.5 in some embodiments, greater than 1.6 in some embodiments, greater than 1.7 in some embodiments, greater than 1.8 in some embodiments, greater than 1.9 in some embodiments, greater than 2.0 in some embodiments, greater than 2.1 in some embodiments, or greater than 2.2 in some embodiments.

Bonding layer 11 may be substantially free of traditional organic-based adhesives such as epoxies, since such adhesives tend to have low indices of refraction. Bonding layer 11 may also be formed from a low index of refraction material, i.e., a material having an index of refraction less than about 1.5 at the emission wavelengths of LED die. Magnesium fluoride, for example, is one such bonding material. Low index optical glasses, epoxies, and silicones may also be suitable low index bonding materials.

Bonding layer 11 may also be formed from a glass bonding material such as Schott glass LaSFN35, LaF10, NZK7, NLAF21, LaSFN18, SF59, or LaSF3, or Ohara glass SLAH51 or SLAM60, or mixtures thereof. Bonding layer 11 may also be formed from a high index glass, such as (Ge, As, Sb, Ga)(S, Se, Te, F, Cl, I, Br) chalcogenide or chalcogenhalogenide glasses, for example. Lower index materials, such as glass and polymers may be used. Both high and low index resins, such as silicone or siloxane, are available from manufacturers such as Shin-Etsu Chemical Co., Ltd., Tokyo, Japan. The side chains of the siloxane backbone may be modified to change the refractive index of the silicone.

Bonding layer 11 may be applied by any suitable method, including evaporating, sputtering, chemical vapor deposition, dispensing, printing, spray coating, spin coating, or blade coating. A high index bond material may be deposited in fluid form, and may remain fluid up to the moment of connection, or may be partially solidified or gelled at the moment of connection, or may be a solid that tackifies upon heating to enable easy connection. The high index bond material may react to form a solidified bond that may range from a gelled state to a hard resin.

In some embodiments, an optional second wavelength converting element 14 is disposed over semiconductor wavelength converting element 12. Optional second wavelength converting element 14 may be any of the wavelength converting materials described above. An optional bonding 15 layer may attach second wavelength converting element 14 to semiconductor wavelength converting element 12, or they may be directly bonded without an intervening bonding layer, or they may be spaced apart from each other. Bonding layer 15 may be formed from the materials and by the methods described above for bonding layer 11. Bonding layer 15 need not be the same material as bonding layer 11. In some embodiments, the positions of semiconductor wavelength converting element 12 and second wavelength converting element 14 are reversed such that second wavelength converting element 14 is disposed between the LED 10 and the semiconductor wavelength converting element 12.

In some embodiments, LED 10 emits blue light, semiconductor wavelength converting element 12 absorbs the blue light and emits red light, second wavelength converting element 14 is a ceramic phosphor plate that absorbs the blue light and emits yellow or green light. In some embodiments, the light exit surface (often the top surface) of the top wavelength converting element (second wavelength converting element 14 in the configuration illustrated in FIG. 4) is roughened or patterned to enhance light extraction, for example by etching with or without additional photolithography or imprinting steps.

In some embodiments, an optional light extraction element 16 is disposed over the top wavelength converting element. Examples of a light extraction element 16 include a block or plate with a roughened or patterned top and/or bottom surface, or an optical element such as a lens. In some embodiments, light extraction element 16 has an index of refraction closely matched to the second wavelength converting element 14, semiconductor wavelength converting element 12, or LED 10. An optional bonding layer 17 may attach light extraction element 16 to the top wavelength converting element, or they may be directly bonded without an intervening bonding layer, or they may be spaced apart. Bonding layer 17 may be formed from the materials and by the methods described above for bonding layer 11. Bonding layer 17 need not be the same material as bonding layers 11 and/or 15. In some embodiments, the index of refraction of bonding layer 17 is closely matched to second wavelength converting element 14, or LED 10. The indices of refraction of the light extraction element 16 and bonding layer 17, bonding layer 11, or bonding layer 15 may be greater than 1.5 in some embodiments, greater than 1.6 in some embodiments, greater than 1.7 in some embodiments, greater than 1.8 in some embodiments, greater than 1.9 in some embodiments, greater than 2.0 in some embodiments, greater than 2.1 in some embodiments, or greater than 2.2 in some embodiments. The index of refraction of the light extraction element 16 and bonding layer 17 may be equal to or less than 2.4 in some embodiments or equal to or less than 3.5 in some embodiments. In some embodiments, light extraction element 16 may be larger than LED 10 and may extend beyond the edges of LED 10. For example, if light extraction element 16 is a lens, the diameter of the lens may be greater than the length of an edge or of a diagonal of LED 10.

In some embodiments, the top surface of one, some, or all of the LED 10, semiconductor wavelength converting element 12, and second wavelength converting element 14 is roughened, textured, or patterned, for example by mechanical polishing, dry etching, photoelectrochemical etching, molding, grinding, machining, stamping, hot stamping, or chemical polishing.

In some embodiments, one or more of bonding layers 11, 15, and 17 includes a luminescent material that converts light of wavelengths emitted by the active region of LED 10 to other wavelengths. The luminescent material may be conventional phosphor particles, organic semiconductors, II-VI or III-V semiconductors, II-VI or III-V semiconductor quantum dots or nanocrystals, dyes, polymers, or materials such as GaN that luminesce. If a bonding layer includes conventional phosphor particles, the bonding layer should be thick enough to accommodate particles typically having a size of about 5 microns to about 50 microns.

Figure 7:
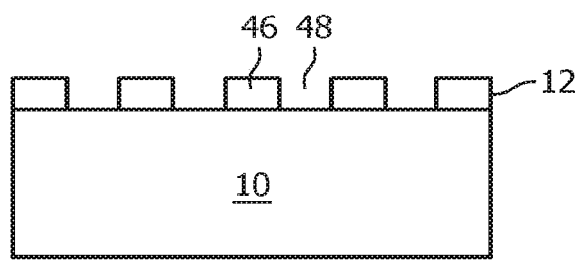
FIG. 7 illustrates a device with a patterned semiconductor wavelength converting element.
Figure 8:
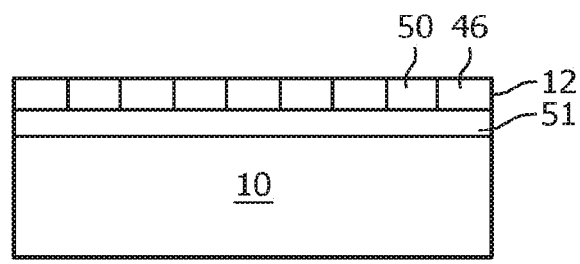
FIG. 8 illustrates a device with patterned semiconductor wavelength converting element formed on a support member.
Figure 9:
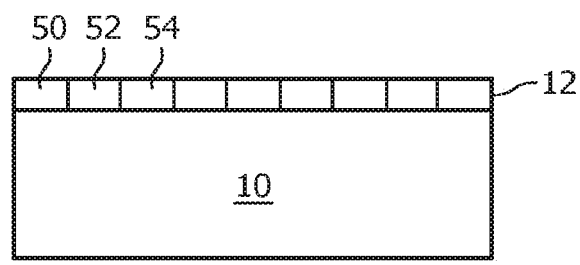
FIG. 9 illustrates a device with multiple wavelength converting elements formed in a pattern.

In some embodiments, the semiconductor wavelength converting element 12 is patterned, as illustrated in FIGS. 7, 8, and 9. For example, the semiconductor wavelength converting element 12 may be patterned to include at least two first regions of semiconductor wavelength converting material and at least one second region without semiconductor wavelength converting material disposed between the first regions.

In the device illustrated in FIG. 7, semiconductor wavelength converting element 12 is patterned to form regions 46 of wavelength converting material and regions 48 without wavelength converting material. Semiconductor wavelength converting element 12 may be selectively formed in only certain regions by, for example, stenciling or screen or ink jet printing, or formed as a continuous sheet of material from which regions 48 are removed by, for example, conventional lithographic techniques. Wavelength converted light is emitted by regions 46 and unconverted light from LED 10 is emitted in regions 48. In one example of the device illustrated in FIG. 7, LED 10 emits blue light and regions 46 emit yellow light, such that the combined light appears white. In another example of the device illustrated in FIG. 7, LED 10 emits blue light, regions 46 emit yellow or green light, and the device is combined with a red-emitting wavelength converting member that is spaced apart from the device of FIG. 7. In another example of the device illustrated in FIG. 7, LED 10 emits blue light, regions 46 emit red light, and the device is combined with a yellow- or green-emitting wavelength converting member that is spaced apart from the device of FIG. 7. The addition of red light to blue and yellow or green light may provide warmer white light and may provide better color rendering than a device without red light.

In the device illustrated in FIG. 8, a patterned semiconductor wavelength converting element 12 is formed on an optional support member 51. The patterned semiconductor wavelength converting element 12 includes regions 46 of wavelength converting material and regions 50 of other material. In some embodiments, regions 50 are a transparent, translucent, or scattering material such as silicone which fills in the gaps between regions 46. In some embodiments, regions 50 are another wavelength converting material that emits light of a different color. Regions 50 may be another semiconductor wavelength converting material, or another wavelength converting material such as phosphor. For example, regions 46 may emit yellow or green light and regions 50 may emit red light, or vice versa. The support member may be, for example, another wavelength converting element such as a ceramic phosphor, or a non-wavelength converting support member as described above. In one example of the device illustrated in FIG. 8, support member 51 is a ceramic phosphor that emits yellow or green light and regions 46 are a semiconductor wavelength converting element that emits red light. In this example, regions 50 are a transparent material, or are omitted, leaving gaps between regions 46. For example, blue light emitted by LED 10 may combine with the yellow or green light emitted by ceramic phosphor 51 and the red light emitted by semiconductor wavelength converting element 12 to form white light. In another example, blue light emitted by LED 10 may combine with yellow or green light emitted by semiconductor wavelength converting element 12 and red light emitted by ceramic phosphor 51 to form white light. In another example, UV light emitted by LED 10 may combine with blue light emitted by ceramic phosphor 51 and yellow or green light emitted by semiconductor wavelength converting element 12 to form white light. Support 51 may be between LED 10 and patterned semiconductor wavelength converting element 12 as shown in FIG. 8 or it may be opposite LED 10 with patterned semiconductor wavelength converting element 12 intervening.

In the device illustrated in FIG. 9, patterned semiconductor wavelength converting element 12 includes three different regions 50, 52, and 54. In some embodiments, all three of regions 50, 52, and 54 are different wavelength converting materials, at least one of which is a semiconductor. In some embodiments, two of regions 50, 52, and 54 are different wavelength converting elements and the third of regions 50, 52, and 54 is a non-wavelength converting transparent or translucent material, or a gap with no material between two of regions 50, 52, and 54. In some embodiments, only two types of regions of two different wavelength converting materials are included and the third type of region is omitted. In one example of the device illustrated in FIG. 9, LED 10 emits blue light, one of regions 52 and 54 is a semiconductor wavelength converting material, regions 52 are a semiconductor material or phosphor that emits red light, regions 54 are a semiconductor material or phosphor that emits yellow or green light, and regions 50 are omitted. In another example of the device illustrated in FIG. 9, LED 10 emits blue light, one of regions 52 and 54 is a semiconductor wavelength converting material, regions 52 are a semiconductor material or phosphor that emits red light, regions 54 are a semiconductor material or phosphor that emits yellow or green light, and regions 50 are a transparent material or gap that allows blue light from LED 10 to escape unconverted.

The patterned semiconductor wavelength converting elements illustrated in FIGS. 7, 8, and 9 may be combined with any other features of the invention described herein. The patterned semiconductor wavelength converting elements illustrated in FIGS. 7, 8, and 9 may be spaced apart from LED 10 rather than disposed on LED 10 as illustrated.

Figure 6:
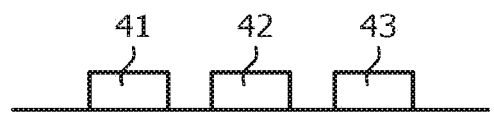
FIG. 6 illustrates a light source for producing white light.

FIG. 6 illustrates a light source for producing white light. A device 41 that produces red light is combined with a device 42 that produces green light and a device 43 that produces blue light. Any or all of the devices 41, 42, and 43 may be any of the devices described above or may include some or all of the features described above. The devices 42 and 43 that produce green and blue light may be, for example, III-nitride light emitting diodes. The light from these diodes may or may not be wavelength converted. For example, the device 42 that produces green light may be a blue- or UV-emitting LED combined with a green-emitting wavelength converting element. The device 41 that produces red light includes an LED combined with a semiconductor wavelength converting element that emits red light and may be as described above in reference to FIGS. 4 and 5. The LED may emit green, blue, or UV light. The semiconductor wavelength converting element is configured such that enough of the light emitted by the LED is converted that light from device 41 appears red. In some embodiments, all of devices 41, 42, and 43 are flip chips.

In some embodiments of FIG. 6, device 43 is omitted. For example, device 41 may emit blue light that combines with yellow or green light emitted by device 42. Device 42 may be a blue-emitting LED combined with a phosphor, ceramic phosphor, or semiconductor wavelength converting element that emits yellow or green light. Blue light from the LED may or may not be present in the spectrum of light emitted by device 42. In another example, a device 41 that emits blue light and a device 42 that emits yellow or green light are combined with a red-emitting phosphor, ceramic phosphor, or semiconductor wavelength converting element to produce a white light source. In another example, a yellow or green emitting device 41 is combined with a red and blue emitting device 42 to produce a white light source. The yellow or green emitting device 41 may be an LED that directly produces yellow or green light by a III-nitride or III-phosphide light emitting layer, or may be a blue-emitting LED combined with a yellow or green emitting phosphor, ceramic phosphor, or semiconductor wavelength converting element. The red and blue emitting device 42 may be a blue-emitting LED combined with a red emitting phosphor, ceramic phosphor, or semiconductor wavelength converting element. In another example, a red emitting device 41 is combined with a yellow or green and blue emitting device 42 to produce a white light source. The red emitting device 41 may be an LED that directly produces red light or may be a blue-emitting LED combined with a red emitting phosphor, ceramic phosphor, or semiconductor wavelength converting element. The yellow or green and blue emitting device 42 may be a blue-emitting LED combined with a yellow or green emitting phosphor, ceramic phosphor, or semiconductor wavelength converting element.

Figure 10:
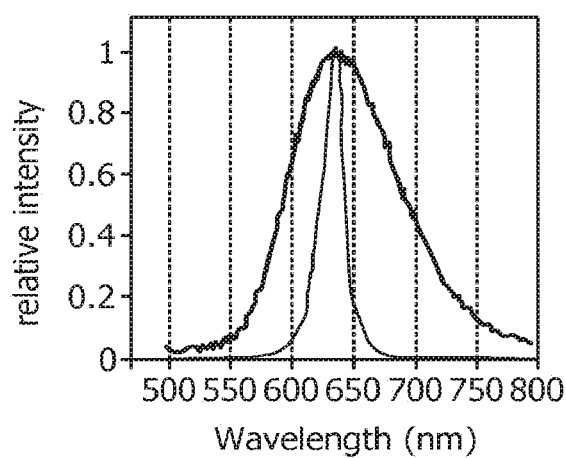
FIG. 10 illustrates the emission spectra of a phosphor and a semiconductor wavelength converting element.

The use of a semiconductor wavelength converting element emitting red light combined with a blue, green, or yellow emitting LED may be used to produce spectrally narrow red light that is difficult to produce with conventional phosphors. A spectrally narrow red source may be used in a white light source that is efficient and has good color rendering. FIG. 10 shows the spectra of a red phosphor and semiconductor wavelength converting element. The thick line on FIG. 10 is the emission spectrum of a red nitridosilicate phosphor having a full width half maximum (FWHM) of about 100 nm. The thin line on FIG. 10 is the emission spectrum of a red-emitting semiconductor wavelength converting element having a FWHM of about 25 nm or less.

The combinations of semiconductor wavelength converting elements and semiconductor light emitting devices described herein may efficiently emit red light with a desirable narrow spectral width that current phosphors cannot achieve. Due to the limitations of phosphors in generating red light, conventional white light sources often combine devices of different material systems, such as, for example, III-nitride devices for generating blue light and green light, with III-phosphide or III-arsenide devices for generating red light. Devices of different materials systems may have different operating characteristics and configurations, such as efficiency as a function of current (droop) or temperature (hot/cold factor), forward voltage, forward and reverse current capabilities, heat dissipation, and temperature handling capabilities. In addition, complications may result from mixing devices of different sized foot prints, different sized chips, and different geometries such as vertical chips with flip chips. In contrast, in embodiments of the present invention, a white light source may be formed from only III-nitride devices. Spectrally narrow red light may be generated by a III-nitride device combined with a semiconductor wavelength converting element. Such a light source may be formed with optimal color, efficiency, and operating characteristics.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
    a semiconductor light emitting device capable of emitting first light having a first peak wavelength;
    a semiconductor wavelength converting element disposed in a path of the first light emitted by the semiconductor light emitting device and comprising a light emitting layer of a semiconductor wavelength material capable of absorbing the first light and in response emitting second light having a second peak wavelength;
    a passivated surface of the semiconductor wavelength converting element; and
    a ceramic phosphor attached to and supporting the semiconductor wavelength converting element and capable of emitting third light having a third peak wavelength and a spectral width greater than a spectral width of the second light.

2. The structure of claim 1 wherein the passivated surface of the semiconductor wavelength converting element is passivated by one of the group consisting of sulfur applied with a $(NH_4)_2S_x$ treatment, hydrogen passivation, oxygen passivation, nitrogen passivation, and native oxide formation.

3. The structure of claim 1 wherein a surface of the semiconductor wavelength converting element is one of textured and roughened.

4. The structure of claim 1 wherein the second peak wavelength is red.

5. The structure of claim 1 wherein the semiconductor wavelength converting material comprises at least one of a III-V semiconductor and a II-VI semiconductor.

6. The structure of claim 1 wherein a surface of the ceramic phosphor is one of textured and roughened.

7. The structure of claim 1 wherein the third peak wavelength is one of green and yellow.

8. The structure of claim 1, wherein the semiconductor wavelength converting element comprises a plurality of light emitting layers separated by at least one barrier layer.

9. The structure of claim 1 wherein the semiconductor wavelength converting element comprises a double heterostructure.

10. The structure of claim 1 wherein the ceramic phosphor is one of transparent, translucent, and scattering.

11. The structure of claim 1 wherein the ceramic phosphor is a ceramic phosphor plate.

12. The structure of claim 1 further comprising a light extraction element, wherein the semiconductor wavelength converting element is disposed between the semiconductor light emitting device and the light extraction element.

13. The structure of claim 12 wherein the light extraction element comprises a transparent plate with a roughened or patterned surface.

* * * * *